United States Patent
Thompson et al.

(10) Patent No.: US 10,317,436 B2
(45) Date of Patent: Jun. 11, 2019

(54) INTERFACE CIRCUITRY FOR BIDIRECTIONAL POWER CONNECTOR

(71) Applicant: APPLE INC., Cupertino, CA (US)

(72) Inventors: Paul M. Thompson, San Jose, CA (US); Parin Patel, Cupertino, CA (US); Alan C. Cooney, Cupertino, CA (US); Alexei E. Kosut, Cupertino, CA (US); Glen A. Rhodes, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 191 days.

(21) Appl. No.: 15/174,371

(22) Filed: Jun. 6, 2016

(65) Prior Publication Data
US 2017/0025879 A1    Jan. 26, 2017

Related U.S. Application Data

(60) Provisional application No. 62/172,090, filed on Jun. 6, 2015.

(51) Int. Cl.
| | |
|---|---|
| *H02J 7/00* | (2006.01) |
| *H02J 7/14* | (2006.01) |
| *G01R 19/165* | (2006.01) |
| *H03K 19/0175* | (2006.01) |
| *G06F 1/26* | (2006.01) |

(52) U.S. Cl.
CPC ....... *G01R 19/16538* (2013.01); *G06F 1/266* (2013.01); *H03K 19/01759* (2013.01)

(58) Field of Classification Search
USPC ....... 320/162, 165, 134, 107, 106, 114, 137, 320/155, 103, 138, 139
See application file for complete search history.

(56) References Cited

U.S. PATENT DOCUMENTS

| | | | | |
|---|---|---|---|---|
| 6,138,240 A | * | 10/2000 | Tran | G06F 21/82 726/19 |
| 2009/0102511 A1 | * | 4/2009 | Hirose | H03K 19/0005 326/30 |
| 2009/0146683 A1 | * | 6/2009 | Kim | H03K 19/0005 326/30 |
| 2011/0043162 A1 | * | 2/2011 | Lee | H02J 7/0077 320/107 |

(Continued)

OTHER PUBLICATIONS

Universal Serial Bus Type-C Cable and Connector Specification (Revision from Apr. 3, 2015), USB 3.0 Promoter Group, Mar. 25, 2016, 248 pages.

(Continued)

*Primary Examiner* — Alexis B Pacheco
(74) *Attorney, Agent, or Firm* — Kilpatrick Townsend & Stockton, LLP

(57) ABSTRACT

Interface circuits that may utilize a limited number of pins to detect a presence of an accessory, determine whether the accessory can provide or receive power, communicate with the accessory regarding at least that transfer of power, and transfer power accordingly. One example may provide detection circuitry for a host that may detect the presence of a pull-down resistor on a data pin of an accessory. The pull-down may indicate that a power consuming accessory has been connected. This example may detect the presence of power on a power pin. The presence of the power on the power pin may indicate that a power providing accessory has been connected.

20 Claims, 10 Drawing Sheets

(56) References Cited

U.S. PATENT DOCUMENTS

| | | | | |
|---|---|---|---|---|
| 2014/0372791 A1* | 12/2014 | Adachi | ............... | G06F 13/1689 |
| | | | | 714/5.1 |
| 2015/0023112 A1* | 1/2015 | Eom | .................. | H03K 19/0005 |
| | | | | 365/189.05 |
| 2015/0048804 A1* | 2/2015 | Toivanen | .............. | H02J 7/0036 |
| | | | | 320/162 |
| 2015/0109023 A1* | 4/2015 | Brunolli | ............. | H03K 19/0005 |
| | | | | 326/30 |
| 2015/0171863 A1* | 6/2015 | Ha | ..................... | H03K 19/0005 |
| | | | | 326/30 |
| 2015/0280712 A1* | 10/2015 | Jung | ................ | H03K 19/00361 |
| | | | | 326/34 |
| 2017/0067954 A1* | 3/2017 | Kim | .................... | H01L 27/0207 |
| 2017/0201238 A1* | 7/2017 | Kim | ......................... | H03K 3/01 |

OTHER PUBLICATIONS

Universal Serial Bus Type-C Cable and Connector Specification (Revision 1.0), USB 3.0 Promoter Group, Aug. 11, 2014, 171 pages.
Universal Serial Bus Type-C Cable and Connector Specification (Revision 1.2), USB 3.0 Promoter Group, Mar. 25, 2016, 221 pages.

\* cited by examiner

INTERFACE CIRCUITRY FOR BIDIRECTIONAL POWER CONNECTOR

CROSS REFERENCE TO RELATED APPLICATIONS

This application claims the benefit of U.S. provisional patent application No. 62/172,090, filed Jun. 6, 2015, which is incorporated by reference.

BACKGROUND

The number of types of electronic devices that are commercially available has increased tremendously the past few years and the rate of introduction of new devices shows no signs of abating. Devices, such as tablet, laptop, netbook, desktop, and all-in-one computers, cell, smart, and media phones, storage devices, portable media players, navigation systems, monitors, and others, have become ubiquitous.

Power and data may be provided from one device to another over cables that may include one or more wire conductors, fiber optic cables, or other conductor. Connector inserts may be located at each end of these cables and may be inserted into connector receptacles in the communicating or power transferring devices.

Accordingly, it may be desirable for one device to be able to detect when a connection to the second device has been made. It may also be desirable to determine whether the second device is capable of providing power or needs to be powered. It may also be desirable that the first device be able to communicate with the second device. For example, the devices may need to communicate regarding which device will provide power and how much power will be provided.

At the same time, there is increasing pressure on device manufacturers to simplify these connectors and reduce pin counts in order to make them smaller and more space efficient. This reduction in pin counts may complicate efforts to provide this needed functionality.

Thus, what is needed are interface circuits that may utilize a limited number of pins to detect a presence of an accessory, determine whether the accessory can provide or receive power, communicate with the accessory regarding at least that transfer of power, and transfer power accordingly.

SUMMARY

Accordingly, embodiments of the present invention may provide interface circuits that may utilize a limited number of pins to detect a presence of an accessory, determine whether the accessory can provide or receive power, communicate with the accessory regarding at least that transfer of power, and transfer power accordingly.

An illustrative embodiment of the present invention may provide interface circuitry for a host that may detect when an accessory is connected. The host device may employ a connector having a limited number pins. Specifically, the host may have a connector with a bidirectional data pin, a bidirectional power pin, and a ground pin. The host may connect to the accessory using these pins via a cable, or these pins may make a direct physical connections with corresponding pins of the accessory. Since the host may be able to either provide or receive power, the host may include circuitry to detect the connection of either a power consuming accessory or a power providing accessory.

In various embodiments of the present invention, a power consuming accessory may include a pull-down resistor on its data pin. The presence of this pull-down resistor on the data pin may identify the accessory as a power consuming accessory. Accordingly, the host interface circuitry may include detection circuitry coupled to the host data pin to detect the presence of this pull-down resistor on the data pin of the accessory. The detection circuitry may include a pull-up and a pull-down resistor, where each resistor may be connected or disconnected. Before a power consuming accessory is connected, the detection circuitry may connect the pull-up and pull-down resistors in an alternating manner. The host detection circuitry may determine that the data pin voltage transitions between a supply voltage, referred to here as VCC, and ground in response to the connections of the resistors. Once the power consuming accessory is connected and the host and accessory data pins are electrically connected, the presence of the power consuming accessory pull-down resistor may be detected.

Specifically, when the host pull-up resistor is connected, the data pin may be prevented from reaching VCC by the power consuming accessory pull-down resistor, and may only reach a voltage between VCC and ground, where the voltage depends on the ratio of the host pull-up to accessory pull-down resistors. The host detection circuitry may recognize this intermediate voltage level and determine that a power consuming accessory has been attached. The host may then provide power on its power pin, which may be received by the power consuming accessory. The power consuming accessory may detect the voltage on its power pin and determine that a host has been connected and is providing power.

Similarly, a host may indicate that it can receive power by providing a pull-down resistor on its data pin. A power providing accessory may include a pull up resistor at its data pin to detect this pull-down. The power providing accessory may detect the pull-down in the host by determining that the data pin is at a voltage between VCC and ground, where the voltage depends on the ratio of the accessory pull-up to host pull-down resistors, as before. The accessory detection circuitry may recognize this intermediate level and determine that a host that may consume power has been attached. When the power providing accessory detects the pull down resistor in the host, the accessory may determine that the host may receive power and may provide power on its power pin. The host may include detection circuitry coupled to the host power pin to detect the presence of this voltage being received from the power providing accessory. This may inform the host that a power providing accessory has been connected.

Accordingly, a host may detect the presence of a power consuming accessory by connecting a pull-up resistor to its data pin and detecting a pull-down resistor connected to the data pin in the accessory. Also, a host may detect the connection of a power providing accessory by detecting a received voltage at a power pin of the host.

Similarly, a power providing accessory may detect a connection of a host by connecting a pull-up resistor to its data pin and detecting a pull-down resistor connected to the data pin in the host. Also, a power consuming accessory may detect the connection of a host by detecting a received voltage at a power pin of the power consuming accessory.

In various embodiments of the present invention, an accessory may be able to either provide power or receive power. In these embodiments, the accessory may employ alternating pull-up and pull-down resistors in a similar manner as the host. Following the connection of the host and the accessory, at some point one of the host or the accessory may detect the presence of a pull-down resistor in the other. The device detecting the pull-down in the other may then expect to provide power as an initial condition. The host and accessory may then negotiate to change or maintain this arrangement as desired.

In these and other embodiments of the present invention, once a connection is detected, the pull-up and pull-down resistors in the host and accessory may remain in place. This may enable the host to detect when a power consuming accessory is removed. For example, where a pull-down on an accessory is detected using a pull-up on a host, when the pull-down is removed, the data pin may return to VCC. This may be detected and used to determine that the power consuming accessory has been disconnected. A disconnection of a power providing accessory may be detected by a host by detecting a removal of power from the power pin of the host. Also, with these resistors left in place, data may be transmitted using open-drain devices. Whether a power consuming or power providing accessory is connected, there may be one pull-up and one-pull down connected to the data pin. The pull-up on the data pin may act as a pull-up for the open-drain devices where a high logic level is the intermediate voltage set by the pull-up and pull-down resistors and the low logic level is the drain-to-source voltage of an active transistor.

In these and other embodiments of the present invention, the presence of voltages on connector contacts or pins may lead to dendritic growth or other corrosion of the contacts or pins. This dendritic growth or corrosion may be particularly troublesome where these contacts or pins are highly visible to a user. It may thus be desirable to limit an average voltage on connector contacts or pins, such as the data and power contacts or pins on the host or accessory. Limiting voltages here also may protect users who may inadvertently touch the contacts or pins. Accordingly, embodiments of the present invention may provide a pull-up for only short periods of time when no accessory is connected. This may keep an average voltage and on the data pin at a low-level, which may help to prevent dendritic growth or corrosion. Duty cycles of 1:10, 1:50, or 1:100 or more may be used.

For this reason, a power providing accessory may provide an alternating pull-up and pull-down resistor circuit as the one used by an accessory that may either provide or receive power. Again, this may keep a voltage on a data pin of the accessory to a low average value, thereby reducing corrosion. After connection of the host and accessory, the power providing accessory may be mistaken by the host for a power consuming accessory, but this can be resolved by later negotiation between the devices.

In various embodiments of the present invention, once a host detects that an accessory is a power consuming accessory, the host may provide a limited amount of power to the accessory. The host may then initiate communications and provide a prompt to the accessory. The prompt may be for identification, authorization, or other type of information. If no response to the prompt is received by the host, the host may stop providing power. The host may further not provide power for a duration, after which the host may provide the same or new prompt to the accessory. If the prompt is properly responded to, then a higher level of power may be provided by the host to the accessory. In other embodiments of the present invention, if no response is received from the accessory, the host may simply continue to provide the lower level of power to the accessory.

In these and other embodiments of the present invention, a device that is not receiving power from any source may not be able to activate a switch to connect a pull-down resistor to ground. In such a situation, the corresponding pull-up resistor in the other device may be used to power a logic circuit that may act as a switch to connect the pull-down to ground. The pull-down may then be detected and the unpowered device may be recognized as a power consuming device. The other device may then be used to power the unpowered device.

In these and other embodiments of the present invention, data may be transferred between a host and accessory in various ways. Relatively low-speed data may be transferred using drivers on the host side and the accessory side. This may work well for transfers of identification, authentication, status, and other types of information between the host and accessory. In other embodiments of the present invention, other channels, such as a Bluetooth channel, may be used to transfer audio and other higher-speed data. In still other embodiments of the present invention, intermediate frequency or radiofrequency signals may be conveyed as wired signals over data or power pins.

In these and other embodiments of the present invention, ground a contacts or pins on either or both a host or accessory may become corroded or have undesired substances on their surfaces such that the ground path has an increased resistance. This increased resistance may cause "ground lift" whereby a voltage of the ground increases or decreases, depending on whether a device is providing or receiving power. For example, when a host provides power to an accessory, return current may flow back from the accessory to the host. Resistance at the ground contacts may make the ground voltage higher in the accessory than in the host. Signals coming from the accessory may appear to have a higher low level caused by this ground lift, thereby making data reception at the host more complicated. Similarly, data received by the accessory from the host may appear to have a lower low or ground voltage. This negative ground lift may also complicate data reception at the accessory. This ground lift may work in the opposite direction when an accessory provides power to a host. In that configuration, return current may flow back from the host to the accessory. Resistance at the ground contacts may make the ground voltage higher in the host than in the accessory. Signals coming from the host may appear to have a higher low level caused by this ground lift, while data received by the host from the accessory may appear to have a lower low or ground voltage.

Accordingly, embodiments of the present invention may employ measures to counteract this ground lift. These measures may include approximating an amount of ground lift that is likely when power is being provided or received, as appropriate. A portion of the amount of expected ground lift, for example one half the ground lift, may be used to adjust a threshold voltage used in receiving data signals in the host and accessory. In other embodiments of the present invention, the ground lift itself may be added to or subtracted from the threshold voltage. For example, a device may provide power. Since it is providing power, it may know that received data may be higher in voltage than expected. The device may then raise its threshold voltage to compensate. Similarly, the device may receive power. Since it is receiving power, it may know that received data may be lower in voltage than expected. The device may then lower its threshold voltage to compensate. In other embodiments of the present invention, the ground lift may be determined by peak detecting a high level of data being received. This measured ground lift may again be used to adjust the threshold voltage. In other embodiments of the present invention, the data signals may be AC coupled through a capacitor.

Embodiments of the present invention may provide interface circuits that may be located in and may connect to various types of devices, such as portable computing devices, tablet computers, desktop computers, laptops, all-in-one computers, cell phones, smart phones, media phones, storage devices, portable media players, navigation systems, monitors, power supplies, adapters, remote control devices, chargers, and other devices.

Various embodiments of the present invention may incorporate one or more of these and the other features described herein. A better understanding of the nature and advantages of the present invention may be gained by reference to the following detailed description and the accompanying drawings.

DESCRIPTION OF EXEMPLARY EMBODIMENTS

Figure 1:
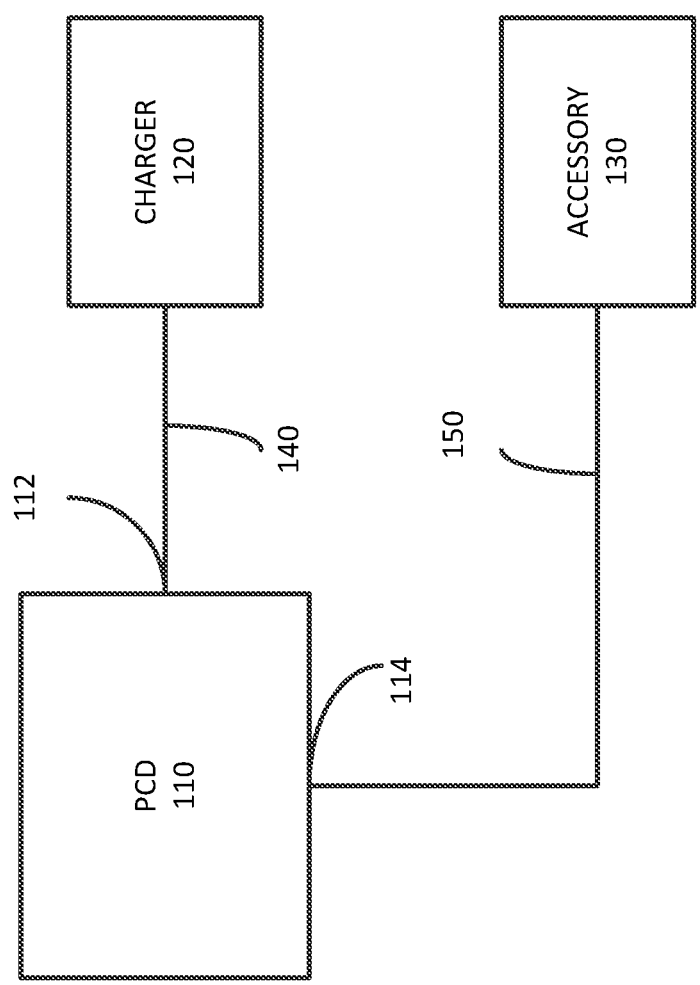
FIG. 1 illustrates an electronic system according to an embodiment of the present invention.

FIG. 1 illustrates an electronic system according to an embodiment of the present invention. This figure, as with the other included figures, is shown for illustrative purposes and does not limit either the possible embodiments of the present invention or the claims.

This figure includes an electronic device connected to two separate power sources, though the electronic device may be connected to three or more power sources. Specifically, a host or electronic device, in this case may portable computing device 110, may be connected to receive power from a first power source, power adapter or charger 120, and a second power source, accessory 130. Portable computing device 110 may include a first connector receptacle 112 for making a connection 140 to charger 120, and a second connector receptacle 114 for making a connection 150 to accessory 130. Either or both connections 140 and 150 may be cables or they may be direct connections. For example, connection 150 may be a direct connection where contacts or pins of accessory 130 are in physical contact with contacts or pins of connector 114 on portable computing device 110.

Host or portable computing device 110 may be a phone, laptop, note book, tablet, storage device, remote control device, or other type of portable computing device. Portable computing device 110 may have a first connector 112 and a second connector 114 that may be a USB, such as a USB type C, a High-Definition Multimedia Interface (HDMI), Digital Visual Interface (DVI), power, Ethernet, DisplayPort, Thunderbolt, Lightning and other types of standard and non-standard interfaces that have been developed, are being developed, or will be developed in the future. In still other embodiments the present invention, connector receptacle 112 may be a proprietary connector having a bidirectional power pin, a bidirectional data pin, and a ground pin. In these and other embodiments the present invention, portable computing device 110 may be coupled to other types of power providing devices such as batteries, uninterruptible power supplies, and other types of chargers or charge storage devices. In each example, a connection, such as connection 140 or 150 or the other connections shown herein, may be a cable, a direct connection, or other electronic pathway.

Host or portable computing device 110 may be able to receive power from charger 120 via first connector 112 or from accessory 130 via second connector 114. In various embodiments of the present invention, portable computing device 110 may determine which of the two available power sources, charger 120 or accessory 130, may provide the most power. Portable computing device 110 may then selectively draw power from the power source having the higher power capability. In other embodiments of the present invention, other criteria may be used in determining which source to choose. Examples are shown in co-pending U.S. provisional application No. 62/172,085, titled POWER DISTRIBUTION USING BIDIRECTIONAL POWER CONNECTOR, which is incorporated by reference.

In these and other embodiments of the present invention, portable computing device 110 may detect a presence of accessory 130 and may receive power from accessory 130 or may provide power to accessory 130. However, connector 114 may have a limited number of pins. For example, connector 114 may be a proprietary connector having a bidirectional power pin, a bidirectional data pin, and a ground pin. Accordingly, embodiments of the present invention may provide interface circuits that may detect a presence of a connection of an accessory and may determine whether an accessory is a power provider, power consumer, or can be either a power provider or power consumer.

Specifically, accessory 130 may transfer power and data with portable communication device 110 via a connection 150 and receptacle 114. Connection 150 may be a direct connection such that contacts or pins on accessory 130 are in direct physical contact with contacts or pins of connector 114 of portable computing device 110. Power may be provided from portable computing device 110 to accessory 130, or accessory 130 may provide power to portable computing device 110. Data may be transferred between portable computing device 110 and accessory 130 as well. Circuitry for an interface that may be used for this is shown in the following figure.

Figure 2:
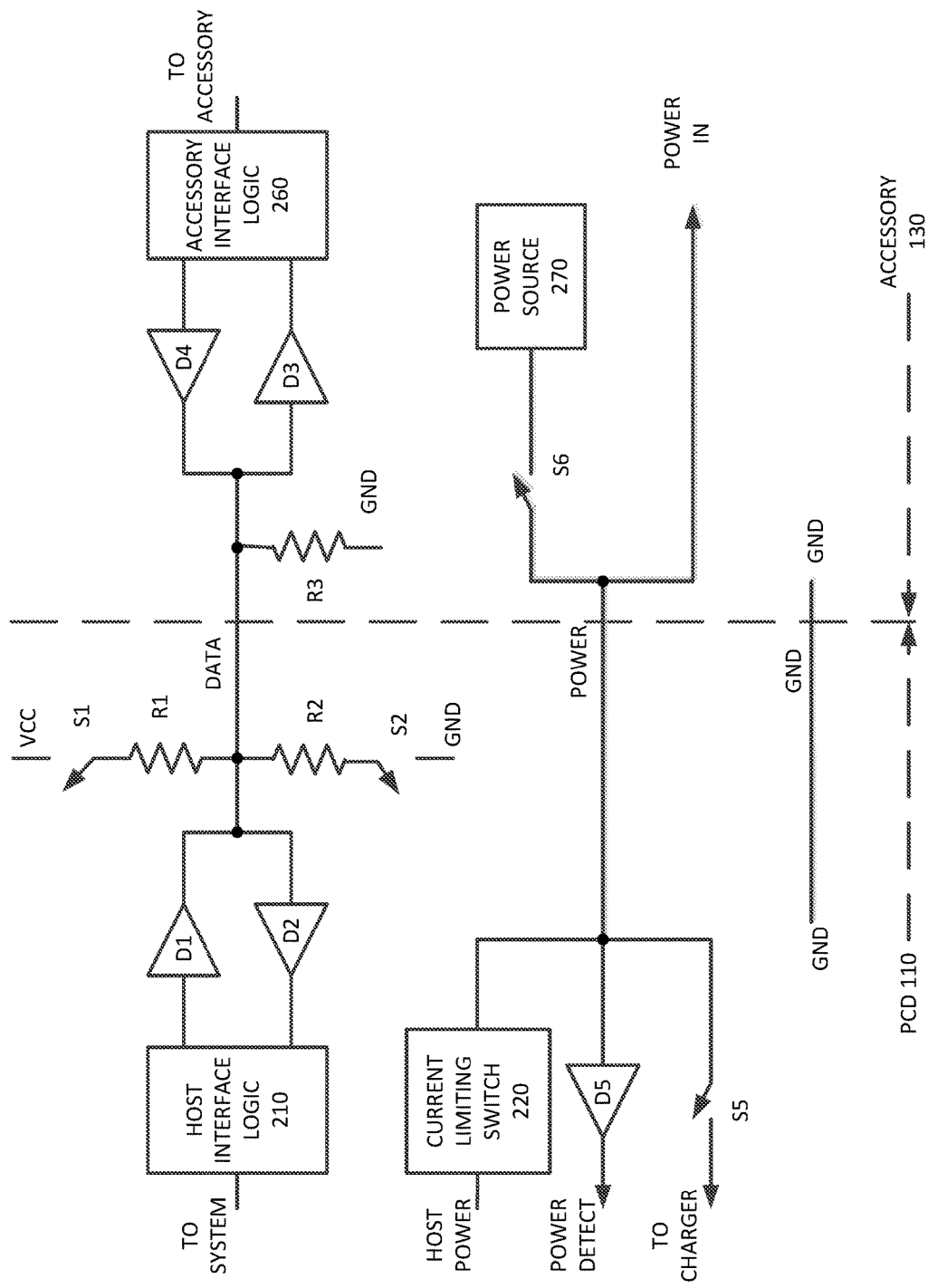
FIG. 2 illustrates interface circuitry for a host and accessory according to an embodiment of the present invention.

FIG. 2 illustrates interface circuitry for a host and accessory according to an embodiment of the present invention. In this example, a host, which may be portable computing device 110, may include data and connect detection circuitry including a host interface logic 210, data transmitter D1, data receiver D2, resistors R1 and R2, and switches S1 and S2. The host interface circuit may further include power providing circuitry including a power source in series with a current limiting switch 220, and power receiving circuitry including an accessory power detect circuit and charger input path. The host may also include one or more additional charger input paths (not shown) that may receive power from connectors. The charger or other circuitry may determine which power input path to draw power from, as described herein. An accessory device, which may be accessory 130, may include resistors R3, data transmitter D4 and receiver D3, as well as accessory interface logic 260.

Again, portable computing device 110 may provide power to an accessory 130 or it may receive power from an accessory 130. Therefore, portable computing device 110 may include detection circuitry to detect that an accessory 130 has been connected and determine whether accessory 130 is capable of providing or receiving power.

Accordingly, portable computing device 110 may include pull-up and pull-down resistors R1 and R2, which may be in series with switches S2 and S2. The host interface logic 210 may close switches S1 and S2 in an alternating manner. The voltage on the data pin may then alternate between VCC and ground until an accessory is connected.

In this example, accessory 130 may include a pull-down resistor R3 connected to its data pin. Again, since accessory 130 includes a pull-down resistor, accessory 130 may be a power consuming accessory. After accessory 130 is connected to the host portable computing device 110, when resistor R2 is connected to ground, the voltage on the data pin may return to ground. The ground level of the data pin conveys no new information as the data pin may return to ground when no accessory 130 is connected. However, when resistor R1 is connected to VCC through S1, the data pin does not rise to VCC. Instead, the data pin voltage may rise to a voltage between ground and VCC. The host interface logic 210 may detect this limited rise in voltage and determine that a power consuming accessory 130 having a pull-down resistor to ground has been connected to portable computing device 110. The host may then provide power on the power pin to the power consuming accessory. The accessory may detect this received power and may determine that a host device has been attached. In other embodiments of the present invention, the accessory may determine that a host device has been attached when it receives data from the host.

In various embodiments of the present invention, the presence of this pull-down resistor may mean different things. For example, the presence of a pull-down resistor may mean that accessory 130 needs to draw power from portable computing device 110, though in other embodiments of the present invention, the existence of a pull-down resistor in accessory 130 may mean that accessory 130 is capable of providing power to portable computing device 110.

In this specific example, the present of resistor R3 as a pull-down resistor may mean that accessory 130 may draw power from portable computing device 110. Accordingly, portable computing device 110 may provide its system power through current limiting switch 220 to accessory 130.

After accessory 130 has been detected by portable computing device 110, the portable computing device 110 and accessory 130 may transfer data using the data pin. In a specific embodiment of the present invention, host interface logic 210 may always act as a master device, where accessory interface logic 260 may always act as a slave device. That is, host interface logic 210 may initiate communications with accessory interface logic 260. These responsibilities may be shared or reversed in other embodiments of the present invention. During data communications using the data pin, resistor R1 may remain connected to VCC, while resistor R3 may remain in place. Open drain pull-down devices may be used for drivers D1 and D4 in the portable computing device 110 and accessory 130, respectively. In this way, logic signals may toggle between ground and a voltage between VCC and ground. Also, when accessory 130 is disconnected, the data pin may return to VCC. This change in voltage on the data pin may be detected and used to determine the disconnection of accessory 130.

In various embodiments of the present invention, other circuit configurations may be employed. For example, resistors R1 and R2 may be the same resistor, where that resistor is either connected to ground or VCC through one of two switches. The two switches should be driven in a break-before-make manner to avoid connecting VCC to ground through the two switches. The resistors may be resistors or other resistances such as field-effect transistors or other active or passive devices.

In these and other embodiments of the present invention, the presence of voltages on connector contacts or pins may lead to dendritic growth or other corrosion of the contacts or pins. This dendritic growth or corrosion may be particularly troublesome where these contacts or pins are highly visible to a user. Accordingly, in various embodiments of the present invention, it may be desirable to limit an average voltage on connector contacts or pins, such as the data and power contacts or pins on portable computing device 110 and accessory 130. Limiting voltages here also may protect users who may inadvertently touch the contacts or pins. Unfortunately, when no accessory 130 is connected to portable computing device 110, switch S1 and pull-up resistor R1 occasionally drive the data pin to a high voltage. Accordingly, embodiments of the present invention may alternate the closing of switches S1 and S2 such that switch S1 is on or closed for only short periods of time. In various embodiments of the present invention, duty cycles of 1:10, 1:50, or 1:100 or more may be used. This may keep an average voltage and on the data pin of portable computing device 110 at a low-level, which may help to prevent dendritic growth or corrosion. One method that a host, such as portable computing device 110, may use in detecting the attachment of an accessory is shown in the following figure.

Figure 3:
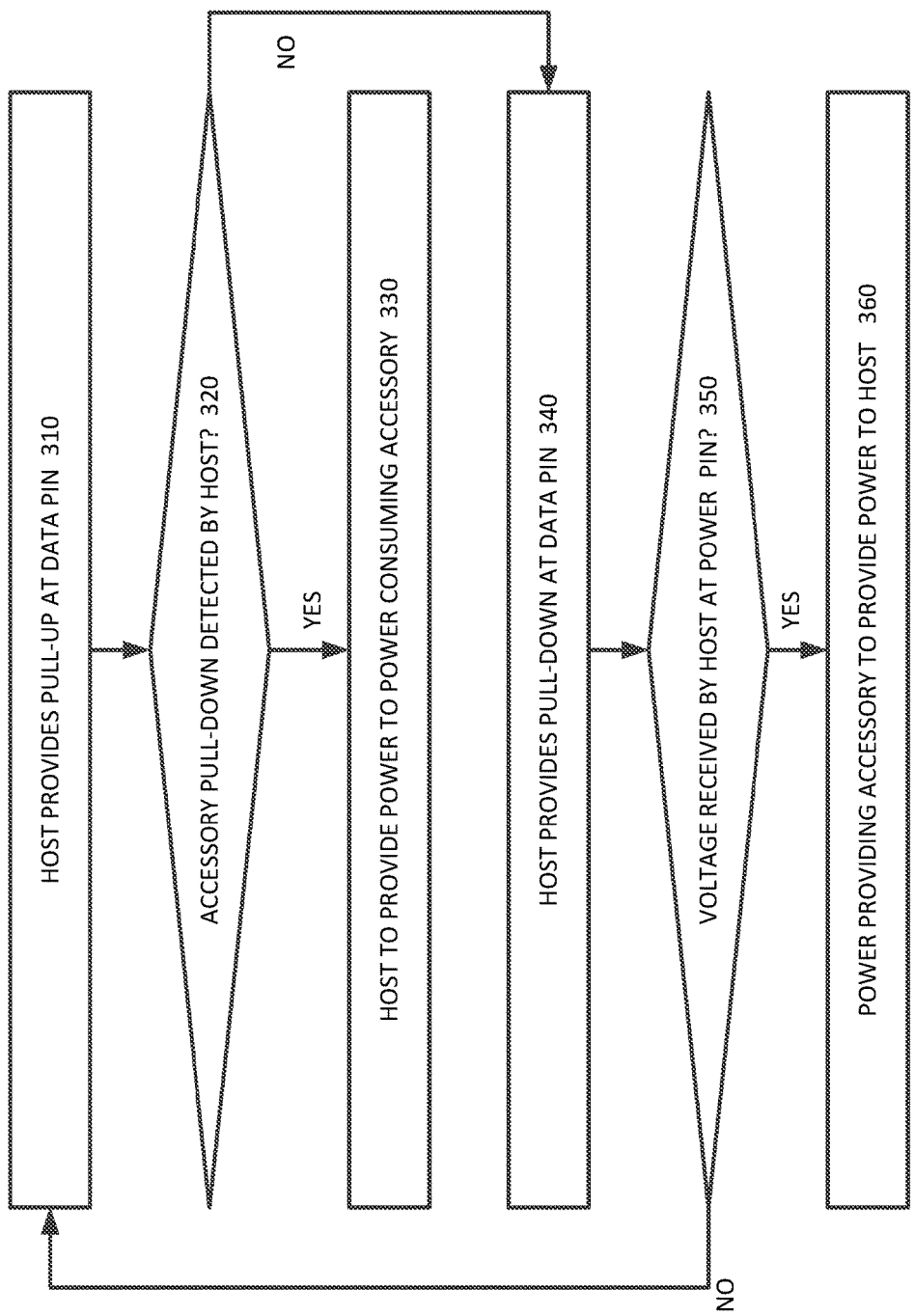
FIG. 3 is a flowchart of a method of detecting a connection of an accessory to a host according to an embodiment of the present invention.

FIG. 3 is a flowchart of a method of detecting a connection of an accessory to a host according to an embodiment of the present invention. In act 310, a host may provide a pull-up at a data pin. If a pull-down is detected in act 320, then the host may determine that a power consuming accessory has been connected in act 330. If no pull-down is detected in act 320, a pull-down may be provided at the data pin by the host in act 340. The pull-down of the host may be detected by a power providing accessory, if present. If a power providing accessory is present, it may provide power over a power pin to the host. In other embodiments of the present invention, the accessory may provide power without waiting to detect, or without detecting, a pull-down on the host. Accordingly, in act 350, it may be determined by the host whether voltage is being received at its power pin. If it is, then the host may determine that the host is connected to a power providing accessory in act 360. If power is not detected at its power pin by the host in act 350, the host can try again with providing a pull-up at the host data pin in act 310.

In some circumstances, stray objects or particulate matter may come in contact with the data pin and make it appear as though a pull-up or pull-down resistor is in place. This may falsely indicate to a host that an accessory has been connected. To limit the damage that this may otherwise create, embodiments of the present invention may limit a current that may be provided to an accessory until the accessory communicates with the host in a prescribed manner. An example is shown in the following figure.

Figure 4:
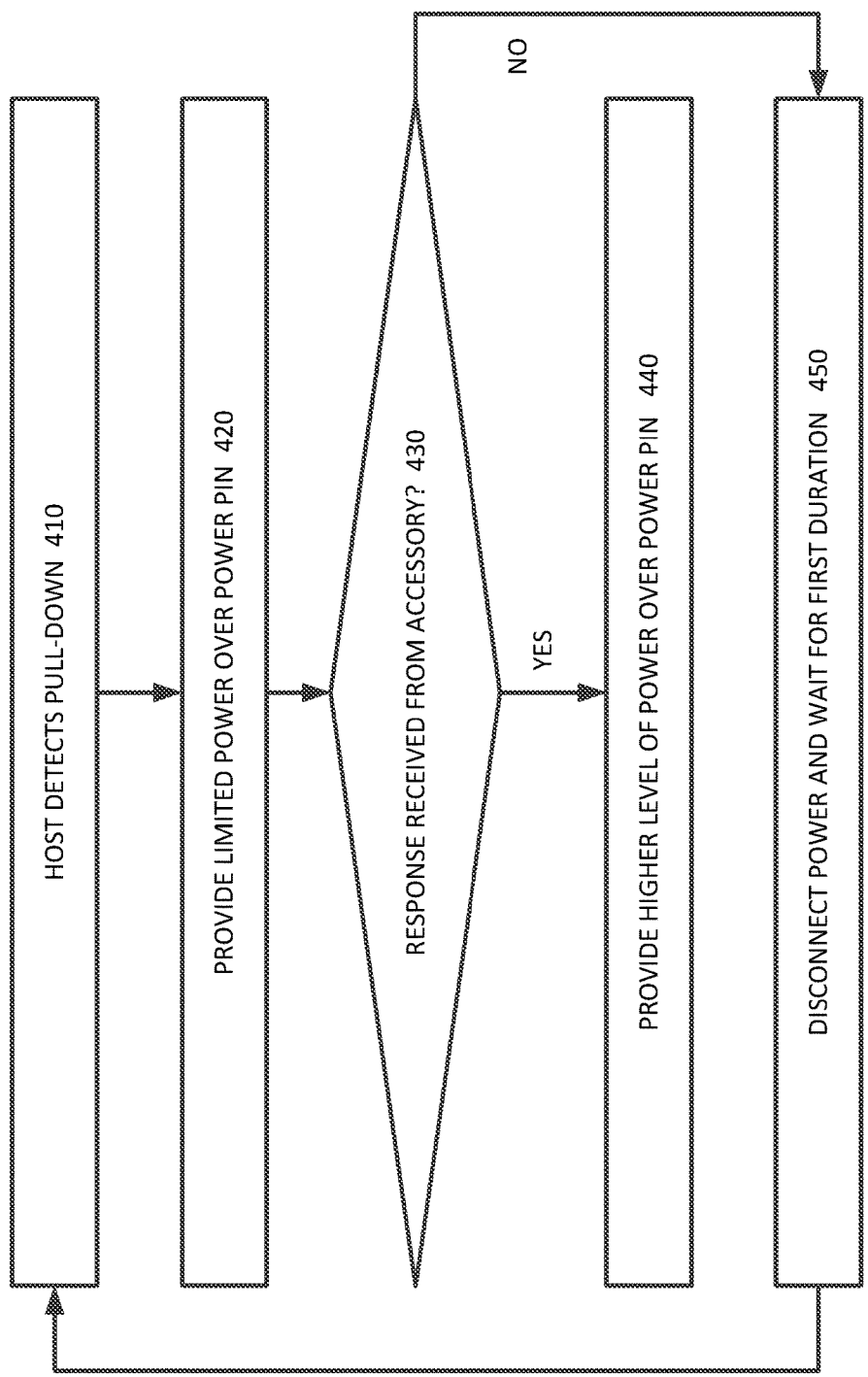
FIG. 4 is a flowchart of a sequence of events may be used by a host in providing power to an accessory according to an embodiment of the present invention.

FIG. 4 is a flowchart of a sequence of events that may be used by a host in providing power to an accessory according to an embodiment of the present invention. In act 410, a host may detect the presence of a pull-down resistor at a data pin. In act 420, a limited amount of power may be provided to the accessory over a power pin. This limited amount of power may be set to provide enough power for accessory to provide a response. In act 430, it is determined whether the host has received this response. It has, a high level of power may be provided over the power pin in act 440. If the response is not received from the accessory in act 430, the power may be disconnected. The host may then wait for a first duration in act 450 before returning to act 410.

In this example, if the accessory does not respond to a prompt by the host, the host may stop providing power. The host may also enter a time-out period before the accessory is again prompted. In other embodiments of the present invention, a host may provide limited power to an accessory even in the absence of a response. This limited power may be set to be enough to power a small circuit, such as a digital clock that may be mounted on a case for the host, or a Bluetooth transceiver that may be attached to the host. That is, the lack of a response by an accessory may be enough to prevent full power from being received by the accessory, though the accessory may still receive a limited amount of power.

In the example of FIG. 2, a power consuming accessory 130 was connected to a portable computing device 110. In the following example, a power providing accessory 130 may be connected to portable computing device 110.

Figure 5:
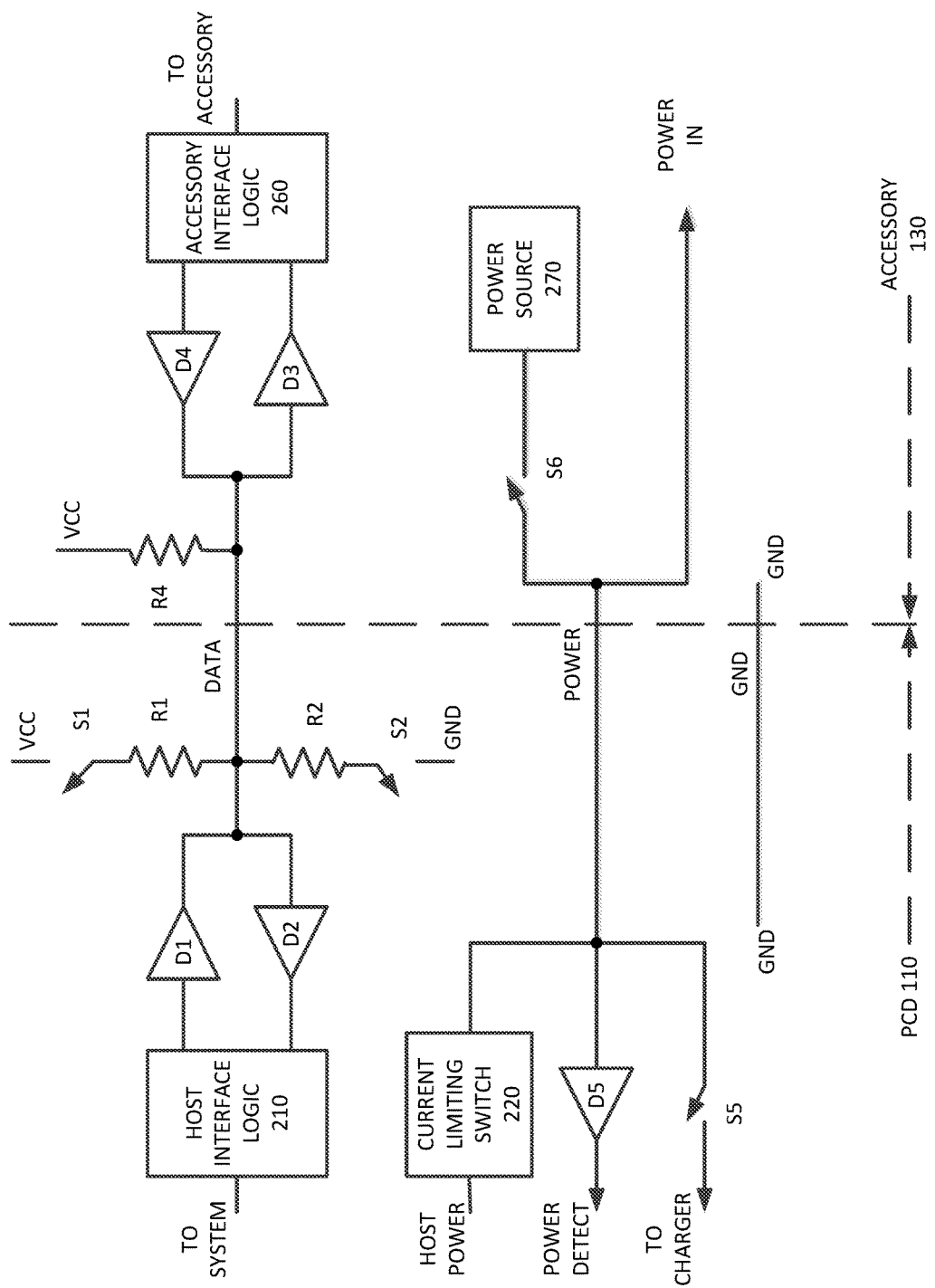
FIG. 5 illustrates interface circuitry for a host and accessory according to embodiments the present invention.

FIG. 5 illustrates interface circuitry for a host and accessory according to embodiments the present invention. In this example, accessory 130 may have a pull-up resistor R4 connected to VCC. When switch S1 in portable computing device 110 is closed, the data pin may be pulled up to VCC through R1. As before, this level may convey no information since the data pin may rise to VCC in the absence of an accessory 130. However, when switch S2 is closed and resistor R2 provide pull-down to ground, the presence of resistor R2 in portable computing device 110 may limit the data pin voltage to a level between VCC and ground. This intermediate level may be detected and used by the accessory interface logic 260 to determine that a host portable computing device 110 that may consume power has been attached.

Accordingly, a power source 270 in accessory 130 may be used to provide power to portable computing device 110. This power may be detected by driver D5, which may inform the host that it is connected to a power providing accessory. The power may also be routed to a charger circuit. Again, portable computing device 110 may use of this power, or power received at another connector depending on various factors, which may be found in co-pending U.S. provisional application No. 62/172,085, titled POWER DISTRIBUTION USING BIDIRECTIONAL POWER CONNECTOR, which is incorporated by reference.

In some circumstances, host portable computing device 110 may not be receiving power from any external source and may have an internal battery that is discharged below a level where it is capable of powering the device. In such a dead-battery situation, host interface logic 210 may not be able to close switch S2. Accordingly, an embodiment of the present invention may provide for switch S2 through pull-up resistor R4. The pull-down resistor R2 may then be detected by accessory 130, which may provide power to the host portable computing device 110 over the power pin. The presence of accessory 130 may be detected by the host portable computing device 110 from this received power after the host portable computing device 110 is sufficiently powered. Once portable computing device 110 is functional, it may continue to receive power, it may provide power, or it may halt power transfers between the two devices. An example of such a method is shown in the following figure.

Figure 6:
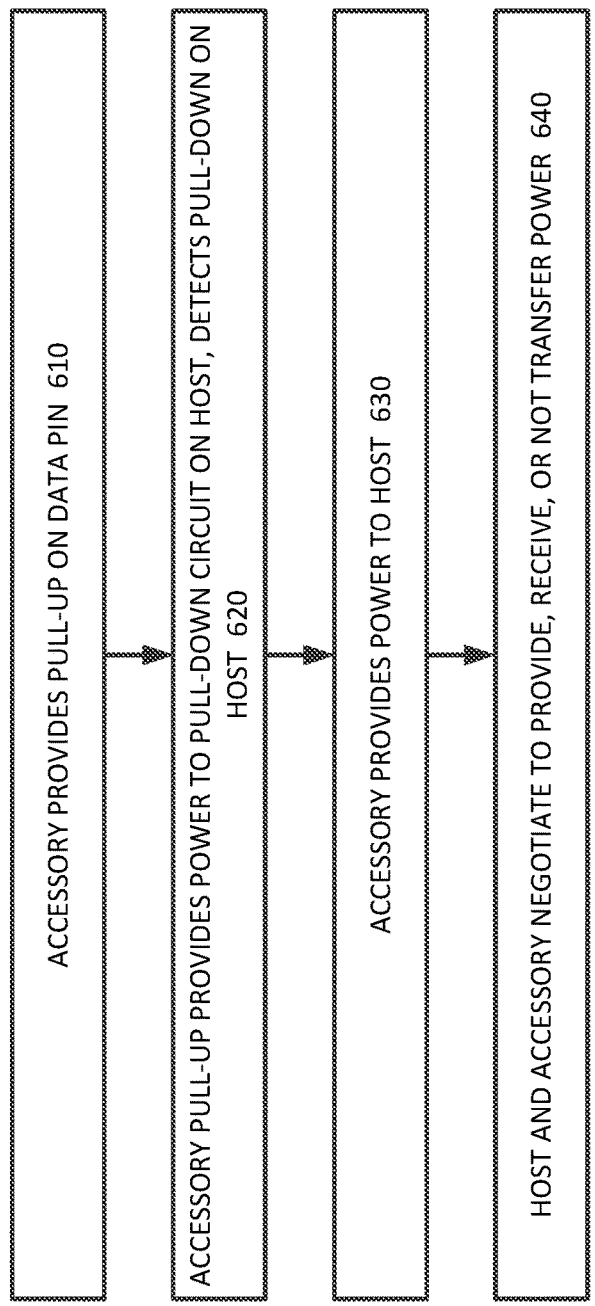
FIG. 6 illustrates a method of providing power from an accessory to an unpowered host according to an embodiment of the present invention.

FIG. 6 illustrates a method of providing power from an accessory to an unpowered host according to an embodiment of the present invention. In act 610, an accessory may provide a pull-up on a data pin. In act 620, the accessory pull-up may provide power to a pull-down circuit on the host. The accessory may detect the presence of the pull-down resistor on the host and then provide power to the host in act 630. In act 640, after the host is sufficiently charged, the host and accessory may negotiate to provide, receive, or not transfer power between them. An example of a circuit that may be used to provide a pull-down resistor and switch in the host is shown in the following figure.

Figure 7:
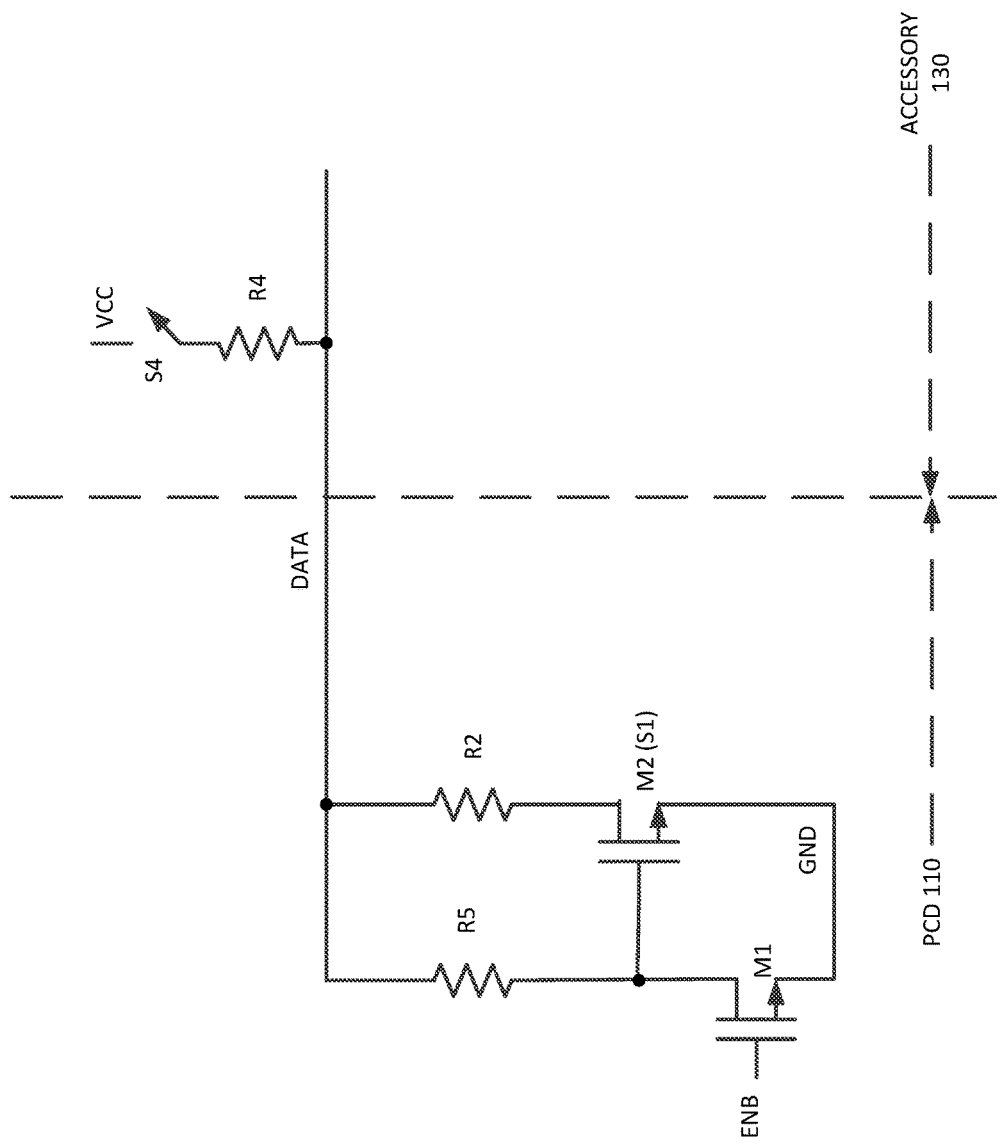
FIG. 7 illustrates an active pull-down that may be used as a pull-down resistor in a host or accessory according to an embodiment of the present invention.

FIG. 7 illustrates an active pull-down that may be used as a pull-down resistor in a host according to an embodiment of the present invention. In this example, transistors M1 and M2 and resistors R2 and R5 may provide the functionality of resistors R2 and S2 in FIG. 5 and other similar embodiments of the present invention. Resistor R4 may either be connected directly to VCC, or may be periodically connected to VCC through switch S4. When resistor R4 is connected to VCC, the voltage on the data pin may be pulled towards VCC. This voltage may couple through resistor R5 thereby turning transistor M2 on. M2 may then conduct and connect resistor R2 to ground, thereby pulling the data pin to a voltage between VCC and ground. Accessory 130 may detect this level and determine that a host, such as portable computing device 110, that is capable of receiving power has been connected to accessory 130. Accessory 130 may then provide power to portable computing device 110. When portable computing device 110 has regained functionality, it may, as appropriate, provide a high signal at the gate of transistor M1. This may turn M1 on thereby driving the gate of transistor M2 low. This may disconnect resistor R2 from ground and allow the data pin voltage to float high. In other embodiments of the present invention, other types of device may be used to provide this pull-down. For example, embodiments of the present invention may employ depletion-mode or enhancement-mode transistors, floating-gate transistors, p-channel or n-channel transistors, or other types of devices such as micro-electro-mechanical switches, relays, or other types of switches for each of the switches in these and other embodiments of the present invention. Also, while this circuitry is shown as being included in the host, this or similar circuitry may be used in an accessory as well.

Again, it may be desirable to keep the average voltage on the data pins or contacts on accessory 130 low in order to prevent corrosion. For this reason, embodiments the present invention may avoid using a hardwired pull-up resistor as shown in FIG. 5, and instead may use a low duty cycle alternating pull-up and pull-down technique similar to that used on the host side. This alternating pull-up and pull-down technique may be used by accessories that are either capable of providing power or capable of both providing and receiving power. In various embodiments of the present invention, the duty cycles, on times, or both, may be different for the host and accessory sides. This variation may prevent a stable state from occurring where each side is not able to detect the other. An example of such an interface circuit is shown in the following figure.

Figure 8:
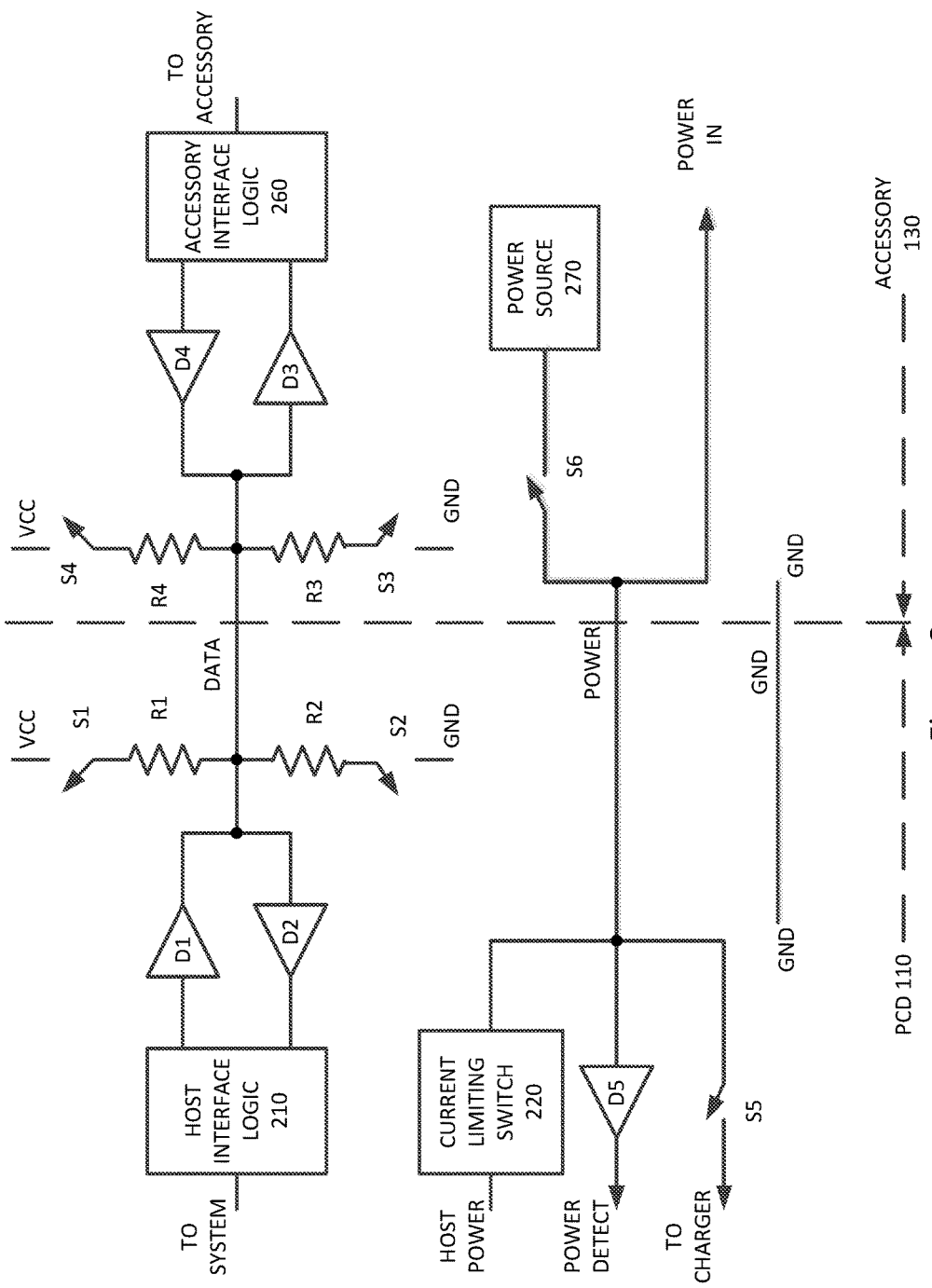
FIG. 8 illustrates interface circuitry for a host and accessory according to an embodiment of the present invention.

FIG. 8 illustrates interface circuitry for a host and accessory according to an embodiment of the present invention. In this example, accessory 130 may include a pull-up resistor R4 that may be coupled to VCC through switch S4, and a pull-down resistor R3, which may be connected to ground via switch S3. Again, in various embodiments of the present invention, other circuit configurations may be employed. For example, resistors R3 and R4 may be the same resistor, where that resistor is either connected to ground or VCC through one of two switches. The two switches should be driven in a break-before-make manner to avoid connecting VCC to ground through the two switches. The resistors may be resistors or other resistances such as field-effect transistors or other active or passive devices.

Before a connection is made between a host and an accessory, each of these devices may alternate between having a pull-up and pull-down resistor at their respective data pins. That is, their data pins or contacts may alternate between VCC and ground. As the two devices are connected, at some point they may have opposing states where one device may have a pull-up resistor, while the other may have a pull-down resistor. One side may see the pull-down in the other device and determine that pull-down side as being the power receiving side. The side seeing the pull-down may then provide power to the side having the pull-down, which may receive the power and determine that it is connected to a power providing device. Portable computer device 110 and accessory 130 may later negotiate to determine which side should provide power and which side should receive power. Depending on which side provides power, the host may provide power through switch 220 to accessory 130, or accessory 130 may provide power through switch S6 and S5 to a charger in portable computing device 110. This accessory power may be detected by the host using driver D5 as before. A method of operation for this detection circuitry is shown in the following figure.

Figure 9:
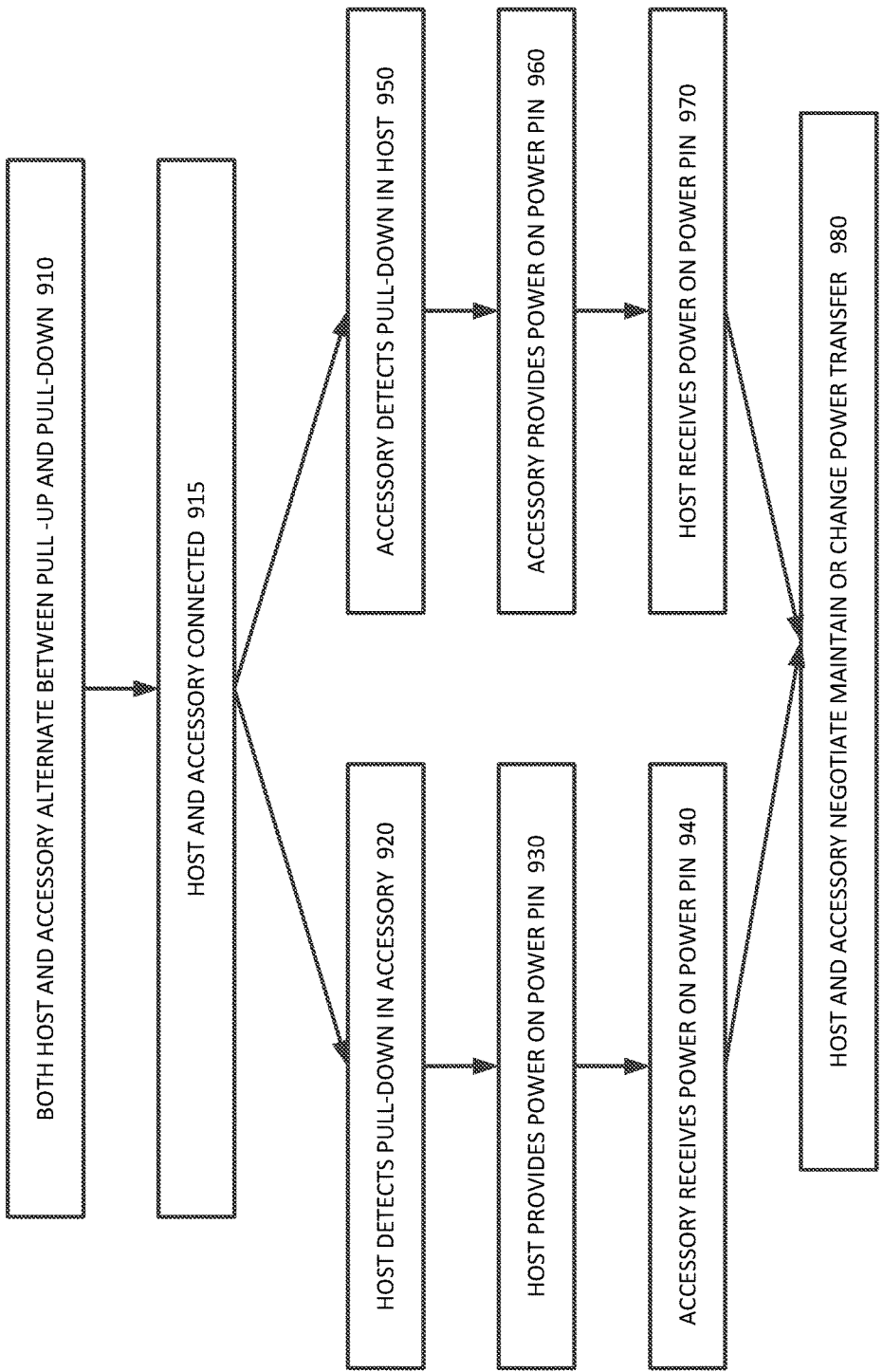
FIG. 9 illustrates a method of determining a connection between a host and an accessory according to an embodiment of the present invention.

FIG. 9 illustrates a method of determining a connection between a host and an accessory according to an embodiment of the present invention. In act 910, both the host and accessory may alternate between providing a pull-up and a pull-down resistor on a data pin. In act 915, an accessory is attached to the host. In act 920 the host may detect a pull-down resistor in the accessory. This may inform the host that a power consuming accessory has been attached. The host may then provide power in act 930. In act 940, the accessory may receive this power determine that a host providing power may have been connected. In act 980, the host and accessory may negotiate to maintain or change the present power transfer arrangement.

Similarly, in act 950 the accessory may detect a pull-down in the host. In act 960, the accessory may provide power to the power pin in response to this detection, though in other embodiments of the present invention, the accessory may provide power without doing the pull-down detection. In act 970, the host may receive this power and determine that a power providing accessory may have been connected. Again, in act 980, the host and accessory may negotiate to maintain or change the present power transfer arrangement.

In various embodiments the present invention, data may be transferred between a host and accessory in various ways. Relatively low-speed data may be transferred using drivers D1 and D2 on the host side and drivers D3 and D4 on the accessory side. This may work well for transfers of identification, authentication, status, and other types of information between the host and accessory. In other embodiments of the present invention, other channels, such as a Bluetooth channel, may be used to transfer audio and other higher-speed data. In still other embodiments of the present invention, intermediate frequency or radiofrequency signals may be conveyed over data or power pins. An example is shown in the following figure.

Figure 10:
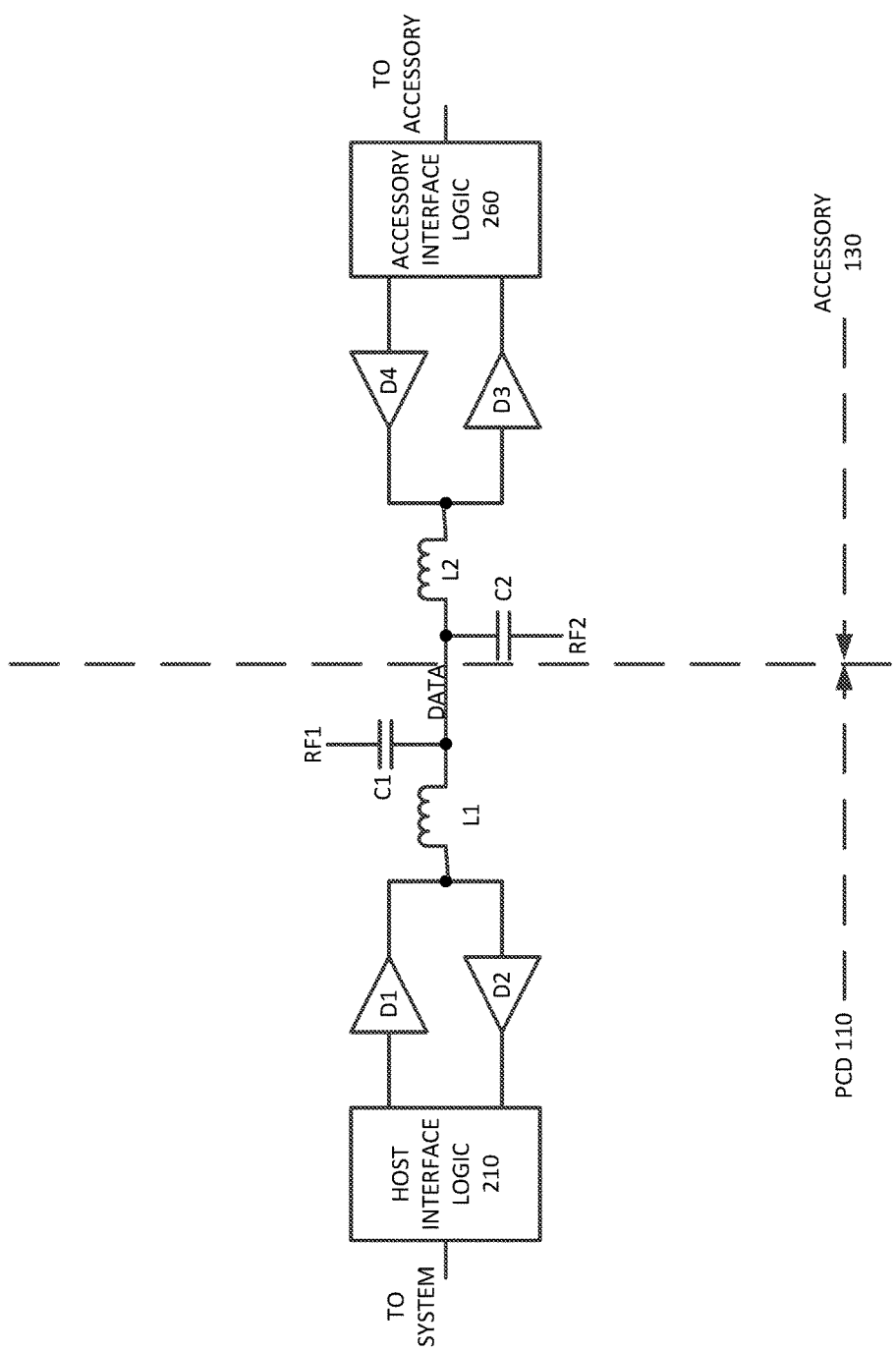
FIG. 10 illustrates interface circuitry for a host and accessory according to an embodiment of the present invention.

FIG. 10 illustrates interface circuitry for a host and accessory according to an embodiment of the present invention. In this example, pull-up and pull-down resistors have been removed for simplicity. Radio or intermediate frequency signals may be coupled onto the data pin via capacitors C1 or C2. The radio or intermediate frequency signals may be received at the other device through the corresponding capacitor. Blocking inductors L1 and L2 to may be used to isolate interface logic circuits 210 and 260 from these signals. The radio or intermediate frequency signals may be conveyed over the data pin in a frequency division or time division multiplexing manner. For example, for a first period of time, host interface logic 210 may communicate with accessory interface logic 260 using drivers D1-D4. During a second period of time, portable computing device 110 may communicate with accessory 130 via the radio frequency or intermediate frequency signal path including capacitors C1 and C2.

In one embodiment of the present invention, a host and accessory may include Bluetooth circuits. These circuits may communicate with other devices using time division multiplexing. When communicating with each other, instead of routing radio frequency signals to antennas in the respective devices, the radio frequency signals may be provided to capacitors C1 and C2. In still other embodiments, a radio frequency signal may be generated from an intermediate frequency signal. These intermediate frequency signals may be provided to capacitors C1 and C2 instead.

In various embodiments of the present invention, the ground a contacts or pins on either or both the host and accessory may become corroded or have undesired substances on their surfaces such that the ground path has an increased resistance. This increased resistance may cause "ground lift" whereby a voltage of the ground increases or decreases, depending on whether a device is providing or receiving power. For example, when a host provides power to an accessory, return current may flow back from the accessory to the host. Resistance at the ground contacts may make the ground voltage higher in the accessory than in the host. Signals coming from the accessory may appear to have a higher low level caused by this ground lift, thereby making data reception at the host more complicated. Similarly, data received by the accessory from the host may appear to have a lower low or ground voltage. This negative ground lift may also complicate data reception at the accessory. This ground lift may work in the opposite direction when an accessory provides power to a host. In that configuration, return current may flow back from the host to the accessory. Resistance at the ground contacts may make the ground voltage higher in the host than in the accessory. Signals coming from the host may appear to have a higher low level caused by this ground lift, while data received by the host from the accessory may appear to have a lower low or ground voltage.

Accordingly, embodiments of the present invention may employ measures to counteract this ground lift. These measures may include approximating an amount of ground lift that is likely when power is being provided or received, as appropriate. A portion of the amount of expected ground lift, for example one half the ground lift, may be used to adjust a threshold voltage used in receiving data signals in the host and accessory. In other embodiments of the present invention, the ground lift itself may be added to or subtracted from the threshold voltage. For example, a device may provide power. Since it is providing power, it may know that received data may be higher in voltage than expected. The device may then raise its threshold voltage to compensate. Similarly, the device may receive power. Since it is receiving power, it may know that received data may be lower in voltage than expected. The device may then lower its threshold voltage to compensate. In other embodiments of the present invention, the ground lift may be determined by peak detecting a high level of data being received. This measured ground lift may again be used to adjust the threshold voltage. In other embodiments of the present invention, the data signals may be AC coupled through a capacitor.

Embodiments of the present invention may provide interface circuits that may be located in various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A method of detecting a connection of an accessory to a host, the method comprising, with the host:
   providing a pull-up resistor at a data pin by closing a first switch, the pull-up resistor and first switch connected between a power supply and the data pin, and if the resulting voltage is not approximately equal to the power supply, then determining that a power consuming accessory has been connected, otherwise
   providing a pull-down resistor at a data pin by closing a second switch, the pull-down resistor and the second switch connected between ground and the data pin;
   determining whether power is being received by the host, and if it is, then determining that a power providing accessory has been connected, otherwise then
   providing the pull-up resistor at a data pin by closing the first switch; then
   transmitting data using a first driver having a first output coupled to the data pin; and
   receiving data using a first receiver having a first input coupled to the data pin.

2. The method of claim 1 wherein if the accessory is a power consuming accessory, then the host provides power to the accessory.

3. The method of claim 2 wherein the host is a portable computing device.

4. The method of claim 1 wherein the pull-up resistor is provided for a first duration and the pull-down resistor is provided for a second duration, the second duration at least ten times as long as the first duration.

5. The method of claim 1 wherein the pull-up resistor is provided for a first duration and the pull-down resistor is provided for a second duration, the second duration at least 50 times as long as the first duration.

6. A first electronic device comprising a pull-down circuit, the pull-down circuit comprising:
   a first resistor having a first terminal coupled to a data pin;
   a first transistor having a drain coupled to a second terminal of the first resistor and a source coupled to ground;
   a second resistor having a first terminal coupled to the data pin and a second terminal directly connected to a gate of the first transistor;
   a second transistor having a drain coupled to the gate of the first transistor;
   a first driver having a first output coupled to the data pin; and
   a first receiver having a first input coupled to the data pin, wherein when the data pin is coupled to a first terminal of a third resistor in a second electronic device and a second terminal of the third resistor is coupled to a power supply of the second electronic device, the first transistor turns on and pulls the drain of the first transistor to near ground.

7. The first electronic device of claim 6 wherein the first electronic device is a host device.

8. The first electronic device of claim 6 wherein the first electronic device is a portable computing device.

9. The first electronic device of claim 6 wherein the second electronic device is an accessory.

10. The first electronic device of claim 6 wherein the third resistor is connected to the power supply.

11. The first electronic device of claim 6 wherein the third resistor is connected to the power supply through a switch.

12. An electronic device comprising:
   a pull-up resistor having a first terminal coupled to a data pin;
   a pull-down resistor having a first terminal coupled to the data pin;
   a first switch coupled between a power supply and a second terminal of the pull-up resistor;
   a second switch coupled between ground and a second terminal of the pull-down resistor;
   input circuitry coupled to the data pin to determine whether the voltage at the data pin is not approximately equal to the power supply when the first switch is closed, and in response to determine that a power consuming accessory has been connected;
   power detection circuitry coupled to a power pin to determine whether power is being received when the second switch is closed, and in response determining that a power providing accessory has been connected;
   a first driver having a first output coupled to the data pin; and
   a first receiver having a first input coupled to the data pin.

13. The electronic device of claim 12 wherein the first driver is an open-drain driver.

14. The electronic device of claim 12 further comprising a power supply coupled through a current limiting switch to the power pin.

15. The electronic device of claim 14 further comprising a charging circuit coupled to the power pin.

16. The electronic device of claim 12 wherein when the first switch is open the second switch is closed and when the first switch is closed the second switch is open.

17. The electronic device of claim 12 wherein the second switch comprises a first transistor having a drain coupled to the second terminal of the pull-down resistor and a source coupled to ground.

18. The electronic device of claim 17 further comprising a first resistor having a first terminal coupled to the data pin and a second terminal directly connected coupled to a gate of the first transistor.

19. The electronic device of claim 18 further comprising a second transistor having a drain coupled to the gate of the first transistor and a source coupled to ground.

20. The electronic device of claim 19 wherein when the data pin is coupled to a first terminal of a resistor in a second electronic device and a second terminal of the resistor in the second electronic device is coupled to a power supply of the second electronic device, the first transistor turns on and pulls the drain of the first transistor to near ground.

\* \* \* \* \*